US011419220B2

(12) United States Patent
Loulidi et al.

(10) Patent No.: US 11,419,220 B2
(45) Date of Patent: Aug. 16, 2022

(54) POLYMER COATINGS AND METHODS FOR DEPOSITING POLYMER COATINGS

(71) Applicant: Europlasma NV, Oudenaarde (BE)

(72) Inventors: Samir Loulidi, Oudenaarde (BE); Eva Rogge, Oudenaarde (BE); Filip Legein, Oudenaarde (BE)

(73) Assignee: EUROPLASMA NV, Oudenaarde (BE)

( * ) Notice: Subject to any disclaimer, the term of this patent is extended or adjusted under 35 U.S.C. 154(b) by 0 days.

(21) Appl. No.: 15/762,270

(22) PCT Filed: Sep. 23, 2016

(86) PCT No.: PCT/EP2016/072774
§ 371 (c)(1),
(2) Date: Mar. 22, 2018

(87) PCT Pub. No.: WO2017/051019
PCT Pub. Date: Mar. 30, 2017

(65) Prior Publication Data
US 2018/0279483 A1 Sep. 27, 2018

(30) Foreign Application Priority Data
Sep. 24, 2015 (EP) ..................................... 15186771

(51) Int. Cl.
*B05D 1/00* (2006.01)
*B05D 3/14* (2006.01)
(Continued)

(52) U.S. Cl.
CPC ............... *H05K 3/282* (2013.01); *B05D 1/62* (2013.01); *B05D 3/145* (2013.01); *C23C 16/30* (2013.01);
(Continued)

(58) Field of Classification Search
CPC .................................. B05D 1/62; B05D 3/145
See application file for complete search history.

(56) References Cited

U.S. PATENT DOCUMENTS 6,613,393 B1   9/2003 Rauschnabel et al.
2008/0225378 A1*  9/2008 Weikert ............... G02B 26/004
                                                428/447
(Continued)

FOREIGN PATENT DOCUMENTS

EP    0570944 A1    11/1993
GB    2462824 A  *  2/2010 ............. H05K 3/282
(Continued)

OTHER PUBLICATIONS

Talib, Zainal Abidin et al., "Plasma Polymerization of Silicon-Containing Monomers", Journal of Photopolymer Science and Technology, vol. 14, No. 1, pp. 129-138. May 14, 2001.
(Continued)

Primary Examiner — Dah-Wei D. Yuan
Assistant Examiner — Kristen A Dagenais-Englehart
(74) Attorney, Agent, or Firm — McKee, Voorhees & Sease, PLC

(57) ABSTRACT

A method for protecting a substrate from corrosion, which method comprises in sequence: a first step including plasma polymerization of a precursor monomer and deposition of the resultant polymer onto at least one surface of a substrate; a second step including exposing the polymer to an inert gas in the presence of a plasma without further deposition of polymer onto the or each surface of the substrate; a third step including plasma polymerization of the precursor monomer used in the first step and deposition of the resultant polymer onto the polymer deposited in the first step so as to increase the thickness of the polymer; and optionally, a fourth step including exposing the polymer to an inert gas in the
(Continued)

presence of a plasma without further deposition of polymer onto the or each surface of the substrate.

15 Claims, 6 Drawing Sheets

(51) Int. Cl.
  *H05K 3/28* (2006.01)
  *C23C 16/30* (2006.01)
  *B05D 5/08* (2006.01)
(52) U.S. Cl.
  CPC .............. *H05K 3/285* (2013.01); *B05D 5/08* (2013.01); *H05K 2203/086* (2013.01); *H05K 2203/087* (2013.01); *H05K 2203/095* (2013.01); *H05K 2203/1476* (2013.01)

(56) References Cited

U.S. PATENT DOCUMENTS

| | | | |
|---|---|---|---|
| 2013/0136871 A1 | 5/2013 | Coulson et al. | |
| 2015/0103504 A1* | 4/2015 | Yokley | B05D 3/144 361/760 |
| 2015/0232688 A1 | 8/2015 | Legein et al. | |
| 2016/0250831 A1* | 9/2016 | Gladish | D06M 15/15 428/137 |
| 2017/0094810 A1* | 3/2017 | Aresta | C23C 16/505 |

FOREIGN PATENT DOCUMENTS

| | | |
|---|---|---|
| GB | 2462824 A | 2/2010 |
| JP | 6479727 A | 3/1989 |
| JP | 2010153859 A | 7/2010 |
| WO | 2014026967 A2 | 2/2014 |
| WO | WO-2014026967 A2 * | 2/2014 .............. B05D 1/62 |

OTHER PUBLICATIONS

Europlasma NV, The International Search Report and Written Opinion of The International Searching Authority, PCT/US2016/072774 filed Sep. 23, 2016.

Wu, Yunying, et al., "Characteristics of ultra water-repellent thin films prepared by combined process of microwave plasma-enhanced CVD and oxygen-plasma treatment", Thin Solid Films 407, 45-49 2002.

Benitez, F. et al., "Improvement of hardness in plasma polymerized hexamethyldisiloxane coatings by silica-like surface modification", Thin Solid Films 377-378, 109-114 2000.

Hozumi et al., "Preparation of silicon oxide films having a water-repellent layer by multiple-step microwave plasma-enhanced chemical vapor deposition", Thin Solid Films, vol. 334, Issues 1-2, pp. 54-59 Dec. 4, 1998.

* cited by examiner

POLYMER COATINGS AND METHODS FOR DEPOSITING POLYMER COATINGS

DESCRIPTION OF INVENTION

The present invention relates to polymer coatings and methods for depositing polymer coatings and, in particular, to polymer coatings for improving the corrosion resistance of substrates, e.g. electronic devices or component parts thereof. In some embodiments, the invention may relate to an electronic device or one or more components thereof-such as a printed circuit board (PCB)—having a polymer coating thereon.

The electronics industry is a fast growing industry. Electronic devices such as smartphones, mobile phones, e-readers, tablets, computers, earphones, headphones, speakers, e.g. portable speakers, are used all around the world on a daily basis.

The primary reason for failure of such electronic devices is damage by fluid ingress or ingress of humidity. Humidity condensates inside the device, and the minerals and salts therein generate corrosion spots, which can cause short circuiting of electrical connections. This short circuiting can lead to damage beyond repair of the device.

Upon exposure to water (or other liquids), many manufacturers advise their customers to dry the product as soon as possible. However, some devices have complex designs such that even after up to 48 hours of drying, water/condensation can remain in the device. Thus, many devices are damaged beyond repair either upon immediate exposure to water or during the drying process due to prolonged water exposure.

The most severe damage is observed when the device is powered on during water ingression. Water on a powered electronic circuit that has not had any protective coating applied thereon can result in almost instant corrosion and consequent short circuiting of the electronics. This is because the minerals and salts dissolved in water act as electrical conductors.

Embodiments of the present invention seek to provide improved methods for depositing polymer coatings onto surfaces of substrates (such as electronic devices or component parts thereof) which methods have the effect of improving the water resistance of the deposited coating. In some embodiments, the invention seeks to provide a polymer coating which, when applied on a substrate, is able to prevent (or at least substantially prevent) water ingress through the coating to the substrate, especially in cases when the component or device including the substrate is powered on whilst exposed to water.

In one aspect of the invention we provide a method for protecting a substrate from corrosion, which method comprises in sequence:
  a first step including plasma polymerization of a precursor monomer and deposition of the resultant polymer onto at least one surface of a substrate;
  a second step including exposing the polymer to an inert gas in the presence of a plasma without further deposition of polymer onto the or each surface of the substrate;
  a third step including plasma polymerization of the precursor monomer used in the first step and deposition of the resultant polymer onto the polymer deposited in the first step so as to increase the thickness of the polymer; and
  optionally, a fourth step including exposing the polymer to an inert gas in the presence of a plasma without further deposition of polymer onto the or each surface of the substrate.

The inert gas used in the optional fourth step may be the same as or different from the inert gas used in the second step.

The applicant has discovered that the step(s) of exposing the polymer to an inert gas in the presence of a plasma without further deposition of polymer increases the density of the polymer coating and/or changes the orientation of functional groups on at least the surface of the polymer, thereby leading to improved resistance to water through the polymer coating. For instance, the step(s) of exposing the polymer to an inert gas in the presence of a plasma without further deposition of polymer can promote further crosslinking of at least the surface of the polymer, which has the effect of increasing the number of barriers through which water must diffuse to reach the underlying substrate.

In other words, exposing the polymer to an inert gas has the effect of modifying the surface of the polymer coating (without destroying the polymer coating) to improve its resistance to water. Exposing the polymer to a reactive gas, such as $H_2$ or $O_2$, could at least partially destroy the polymer which could lead to a reduction in its resistance to water.

The method may include repeating the third and fourth steps at least once more, so that the sequence is essentially first step:second step:first step:second step:first step:second step.

The method may include repeating the third and fourth steps up to about ninety nine times, e.g. up to about forty nine times, e.g. up to about nineteen times, e.g. up to about nine times, such as up to about four times. For instance, in a case where the third and fourth steps are repeated ninety nine times the total sequence is essentially (first step:second step)×100.

By repeating the steps the thickness of the polymer coating can be increased, whilst at the same time providing discrete regions of the polymer with increased density. For instance, the first step may be carried out to deposit a polymer coating followed by carrying out the second step. The second step does not add to the polymer coating but instead increases its density. The first step may then be carried out again so as to increase the thickness of the polymer coating, followed by a further second step to increase the density of the newly deposited polymer coating. By successively carrying out the first and second steps the resultant polymer coating has increased numbers of barriers through which water must diffuse. Thus, a polymer coating deposited by this method is more resistant to water when compared to polymer coatings having the same thickness, but deposited using conventional methods such as those including a single coating step.

It goes without saying that the resultant coating consists of a polymer formed from a single monomer species, albeit with discrete regions of increased density. This 'single layer' differs from the "multi-layer" polymer coatings found in the prior art which include two or more discrete layers of polymer, whereby at least two of the discrete layers are formed from different monomer species. The polymer coating of the present invention is formed from a single monomer species.

The method may involve repeating the steps until the polymer coating has a total thickness of from approximately 200 nm to approximately 10000 nm, e.g. approximately 400 nm to approximately 8000 nm, such as approximately 5000 nm or approximately 2500 nm or approximately 2000 nm or approximately 1500 nm or approximately 1000 nm.

Each step including plasma polymerization of the precursor monomer may include depositing polymer having a thickness from approximately 10 nm to approximately 500 nm, e.g. from approximately 50 nm to approximately 200 nm, such as approximately 100 nm. In some embodiments, each step including plasma polymerization of the precursor monomer may include depositing polymer having a thickness from approximately 25 nm to approximately 200 nm, such as approximately 50 nm.

Each step including plasma polymerization of a precursor monomer may be carried out for a duration that is greater than or equal to the duration of the step(s) including exposing the polymer to an inert gas in the presence of the plasma without further deposition of polymer.

The duration of the step(s) including exposing the polymer to an inert gas in the presence of the plasma without further deposition of polymer may be from about 10 seconds to about 20 minutes, e.g. from about 1 minute to about 10 minutes. In some embodiments, the duration of the step(s) including exposing the polymer to an inert gas in the presence of the plasma without further deposition of polymer may be from about 10 seconds to about 1 minute.

The power of the plasma in the step(s) including exposing the polymer to an inert gas in the presence of the plasma without further deposition of polymer may be equal to or lower than the power of the plasma in each step including plasma polymerization of a precursor monomer. Alternatively, the power of the plasma in the step(s) including exposing the polymer to an inert gas in the presence of the plasma without further deposition of polymer may be higher than the power of the plasma in each step including plasma polymerization of a precursor monomer, e.g. up to 200% of the power of the plasma in each step including plasma polymerization of a precursor monomer.

The power of the plasma in each step including plasma polymerization of a precursor monomer may be from approximately 20 Watts to approximately 750 Watts, e.g. approximately 50 Watts to approximately 250 Watts.

The method may include continuous wave or pulsed wave plasma deposition.

The power of the plasma in the step(s) including exposing the polymer to an inert gas in the presence of the plasma without further deposition of polymer may be from approximately 10 Watts to approximately 750 Watts, e.g. approximately 50 Watts to approximately 150 Watts.

The applicant has discovered that by carrying out the step(s) including exposing the polymer to an inert gas in the presence of the plasma without further deposition of polymer for a shorter duration than each step including plasma polymerization of a precursor monomer the resultant polymer coating has increased resistance to water. Without being bound to any particular theory, it is believed that by carrying out the step(s) including exposing the polymer to an inert gas in the presence of the plasma without further deposition of polymer for relatively short periods the degree of crosslinking of the polymer coating is maximized without causing degradation of the polymer coating. In other words, the physical properties of the polymer are changed during said step(s) by exposure to the inert gas in the presence of a plasma.

The inert gas may comprise any one of Ar, $N_2$, He, Ne, Kr, Xe, or a mixture thereof.

The precursor monomer may be:
acrylate;
methacrylate; or
organosilane.

The precursor monomer may comprise a compound having the general formula (I):

$$C_nF_{2n+1}C_mX_{2m}CR^1Y\text{—OCO—}C(R^2)\text{=}CH_2 \quad \text{(I)}$$

wherein:
n is 2 to 8;
m is 0 to 9;
X and Y are independently H, F, Cl, Br or I;
$R^1$ is H or alkyl, e.g. —$CH_3$, or a substituted alkyl; and
$R^2$ is H or alkyl, e.g. —$CH_3$, or a substituted alkyl.

In some embodiments the monomer is 1H, 1H, 2H, 2H-perfluorodecyl acrylate.

The precursor monomer may comprise a compound having the general formula (II):

$$R^3\text{—}Z\text{—}R^4 \quad \text{(II)}$$

wherein:
Z is O or NH;
$R^3$ and $R^4$ are each independently -$Si(R^5)(R^6)R^7$; and
$R^5$, $R^6$, $R^7$ are each independently H, an alkyl group of up to 10 carbon atoms or an alkenyl group of up to 10 carbon atoms, wherein, in each of $R^3$ and $R^4$, at least two of $R^5$, $R^6$ or $R^7$ is an alkyl group; and
the total number of carbon atoms in the precursor monomer is not more than 20.

In embodiments $R^5$, $R^6$ and $R^7$ are all alkyl groups. The alkyl groups may be straight or branched-chain. The alkyl groups may be methyl or ethyl groups.

In some embodiments the precursor monomer is hexamethyldisiloxane (HMDSO).

In embodiments $R^5$ and $R^6$ may be alkyl groups and $R^7$ may be an alkenyl group. The alkyl groups may be straight or branched-chain. The alkyl groups may be methyl or ethyl groups. The alkenyl group may be vinyl.

In some embodiments the precursor monomer is 1,3-divinyltetramethyldisiloxane.

Advantages of using organosilane precursor monomers having an alkenyl group over organosilane precursor monomers without an alkenyl group are as follows. The presence of one or more C=C in the alkenyl group means that this category of precursor monomer is more reactive than, for example, HMDSO. As such, 1,3-divinyltetramethyldisiloxane, for example, requires less energy to initiate polymerisation than HMDSO. Therefore, precursor monomers having alkenyl groups may not require reactive carrier gasses, such as $O_2$, because such monomers can readily polymerise in the plasma without. Due to the increased reactivity such monomers may also exhibit high rates of deposition when compared to organosilane precursor monomers without an alkenyl group. Advantageously, higher deposition rates lead to shorter processing times and higher throughput for users. The inventors have also determined that the presence of the alkenyl group results in a polymer coating having a denser crosslinked structure when compared to organosilane precursor monomers without an alkenyl group. Denser crosslinking has an effect of improving the polymer coatings resistance to water and other liquids.

The precursor monomer may comprise a cyclic compound having the general formula (III):

$$\text{—}[Si(CH_3)_q(H)_{2-q}\text{—}Z\text{-}]_p\text{-} \quad \text{(III)}$$

wherein:
p is 2 to 10;
q is 0 to 2;
Z is O or NH; and the total number of carbon atoms in the precursor monomer is not more than 20.

The precursor monomer may be one in which p is 3, or p is 4, or p is 5, or p is 6. In embodiments the precursor monomer is hexamethylcyclotrisilazane.

The precursor monomer may comprise a compound having the general formula (IV):

$$CH_2=C(R^8)-Si(R^9)(R^{10})-R^{11} \qquad (IV)$$

wherein:
 R$^8$ is H or an alkyl group, e.g. —CH$_3$; and
 R$^9$, R$^{10}$ and R$^{11}$ are each independently H, an alkyl group of up to 10 carbon atoms or an alkoxy group (R$^{12}$—O), wherein R$^{12}$ is preferably —C$_t$H$_{2t+1}$, wherein t is 1 to 10.

The precursor monomer may comprise a compound having the general formula (V):

$$R^{13}-Si(R^{14})(R^{15})-R^{16} \qquad (V)$$

wherein:
 R$^{13}$ is H or an alkyl group, e.g. —CH$_3$;
 R$^{14}$, R$^{15}$ and R$^{16}$ are each independently H, an alkyl group of up to 10 carbon atoms or an alkoxy group (R$^{12}$—O), wherein R$^{12}$ is preferably —C$_t$H$_{2t+1}$, wherein t is 1 to 10.

The alkoxy groups may be straight, branched or cyclic. In some embodiments the alkoxy groups are methoxy or ethoxy groups.

The precursor monomer may comprise a compound having the general formula (VI):

$$CH_2=C(R^{17})C(O)-O-(CH_2)_r-Si(R^{18})(R^{19})-R^{20} \qquad (VI)$$

wherein:
 r is from 0 to 10;
 R$^{17}$ is H or an alkyl group, e.g. —CH$_3$;
 R$^{18}$, R$^{19}$ and R$^{20}$ are each independently H, an alkyl group of up to 10 carbon atoms or an alkoxy group (R$^{12}$—O), wherein R$^{12}$ is preferably —C$_t$H$_{2t+1}$, wherein t is 1 to 10.

The precursor monomer may be one in which r is 2 and wherein each of R$^{18}$, R$^{19}$ and R$^{20}$ are an alkoxy group, e.g. methoxy. In some embodiments the precursor monomer is 3-(trimethoxysilyl)propyl acrylate.

The alkoxy groups may be straight, branched or cyclic. In some embodiments the alkoxy groups are methoxy or ethoxy groups.

In a second aspect of the invention we provide a method for protecting an electronic device from corrosion, which method comprises:
 a. providing an electronic device including a printed circuit board having electronic components applied thereto;
 b. plasma polymerization of a first precursor monomer and deposition of the resultant polymer onto at least one surface of the printed circuit board, wherein the first precursor monomer is an alkane, alkene, alkyne or a mixture thereof; and
 c. plasma polymerization of a second precursor monomer and deposition of the resultant polymer onto the polymer formed in step b., wherein the second precursor monomer is an acrylate, methacrylate, organosilane or a mixture thereof.

The alkane, alkene or alkyne may be substituted, e.g. with one or more heteroatom(s).

The first precursor monomer may comprise a linear or branched alkane having the general formula (VII):

$$C_uX_{2u+2} \qquad (VII)$$

wherein:
 u is from 1 to 20, preferably from 1 to 10, even more preferably from 2 to 5; and
 X is H, F, Cl, Br or I.

The first precursor monomer may comprise a linear or branched alkene having the general formula (VIII):

$$C_vX_{2v} \qquad (VIII)$$

wherein:
 v is from 2 to 20, preferably from 2 to 10;
 X is H, F, Cl, Br or I; and
 the first precursor monomer may contain from 1 to 10 carbon-carbon double bonds (C=C).

The first precursor monomer may be ethylene.

The first precursor monomer may comprise a linear or branched alkyne having the general formula (IX):

$$C_wZ_{2w-2} \qquad (IX)$$

wherein:
 w is from 2 to 20, preferably from 2 to 10;
 X is H, F, Cl, Br or I; and
 the first precursor monomer may contain from 1 to 10 carbon-carbon triple bonds (C≡C), preferably from 1 to 2 carbon-carbon triple bonds.

The second precursor monomer may comprise a compound having the general formula (I), (II), (III), (IV), (V) or (VI).

The polymer coating may have a total thickness of approximately 200 nm to approximately 10000 nm, e.g. approximately 400 nm to approximately 8000 nm, such as approximately 5000 nm or approximately 2500 nm or approximately 2000 nm or approximately 1500 nm or approximately 1000 nm. By total thickness, we mean the combined thickness of polymer formed from the first precursor monomer and polymer formed from the second precursor monomer.

The polymer coating formed from the second precursor monomer may have a thickness of approximately 10 nm to approximately 3000 nm, e.g. approximately 20 nm to approximately 1000 nm, e.g. approximately 50 nm to approximately 500 nm or approximately 250 nm.

The polymer coating formed from the first precursor monomer may have a thickness of approximately 50 nm to approximately 9000 nm, e.g. approximately 100 nm to approximately 8000 nm, e.g. approximately 250 nm to approximately 5000 nm, e.g. approximately 500 nm to approximately 2500 nm, such as approximately 2000 nm or approximately 1500 nm or approximately 1000 nm or approximately 750 nm.

In a further aspect of the invention we provide a method for protecting a substrate from corrosion, which method comprises:
 a first step including plasma polymerization of a precursor monomer and deposition of the resultant polymer onto at least one surface of a substrate; and
 subsequently, a second step including exposing the polymer to a gas in the presence of a plasma without further deposition of polymer onto the or each surface of the substrate.

In a further aspect of the invention we provide a method for protecting a substrate from corrosion, which method comprises:
 a. plasma polymerization of a first precursor monomer and deposition of the resultant polymer onto at least one surface of a substrate, wherein the first precursor monomer is an alkane, alkene, alkyne or a mixture thereof; and b. plasma polymerization of a second precursor monomer and deposition of the resultant polymer onto the polymer formed in step a., wherein the second precursor monomer is an acrylate, methacrylate, organosilane or a mixture thereof.

The following features may apply to either aspect of the present invention.

An outgassing and/or pre-treatment step may be carried out prior to plasma deposition of polymer.

Outgassing removes not only contaminants and moisture from a surface of a substrate, but also contaminants and moisture from internal surfaces, i.e. surfaces that are not directly exposed to the atmosphere but can be accessed via openings and channels. Outgassing of the substrates in the plasma chamber prior to conducting the method allows for an improved penetration of the plasma into the substrate, resulting in an improved coating in terms of thickness and performance, in this case corrosion protection.

Pre-treatment may involve carrying out an activation and/or cleaning and/or etching step.

The pre-treatment step may be performed using an inert gas (e.g. He or Ar) or a reactive gas (e.g. $O_2$) or a combination of both.

In embodiments, the precursor monomer may be transported to a plasma chamber by a carrier gas. A carrier gas is typically required when the precursor monomer does not easily vaporise. The carrier gas may be an inert gas which serves solely to transport the precursor monomer. Alternatively, the carrier gas may be a reactive gas which serves both to transport the precursor monomer and contribute to the polymerisation reaction. The carrier gas may contribute to the polymerisation reaction by striking the plasma to ignite the plasma, or by influencing the polymerization reaction to realize coatings with a better performance.

Use of a carrier gas to transport precursor monomers is known in the art and need not be discussed further.

The invention may relate to a polymer coating formed according to a method of any previous aspect.

The invention may also relate to a substrate (such as an electronic device or component part thereof) having a polymer coating formed according to a method of any previous aspect.

Embodiments of the invention will now be described, by way of example only, with reference to the accompanying figures.

To test the performance of coatings an electrical shortcut test was carried out, which involves submersing a substrate—in this case a printed circuit board (PCB)—in water whilst powered.

Figure 1A:
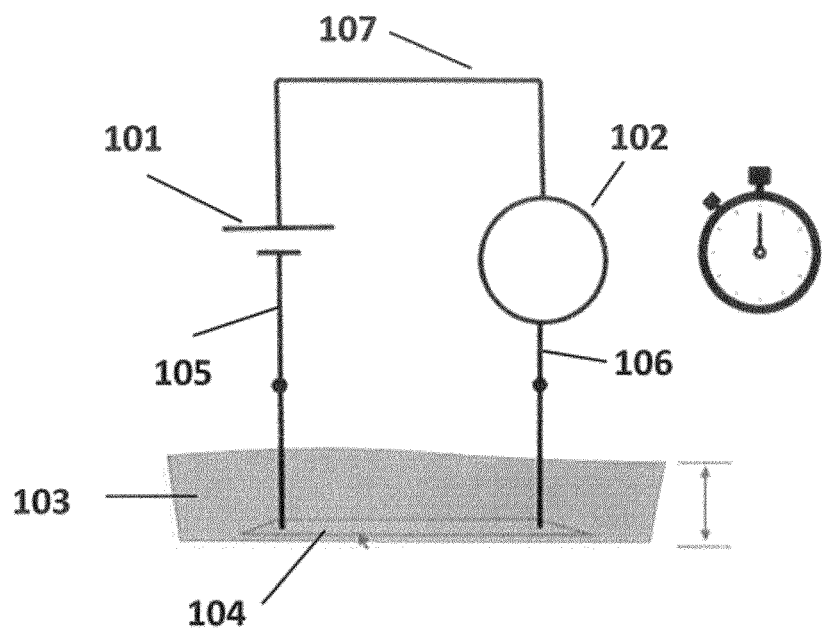
FIGS. 1A and 1B show schematics of an electrical shortcut test.
Figure 1B:
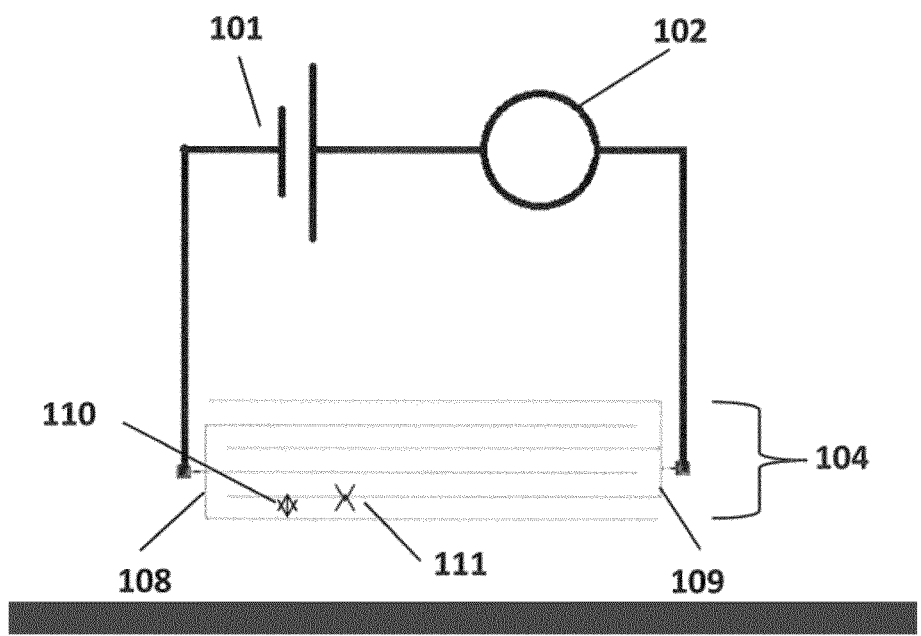

FIGS. 1A and 1B show the schematic set-up of the electrical shortcut test. Wires 105 and 106 are connected to a PCB 104. The opposite end of wire 105 is connected to a power supply 101 and the opposite end of wire 106 is connected to a multimeter 102, which measures currents in the μA and mA range. Multimeter 102 and power supply 101 are connected through a wire 107. After the circuit has been prepared, the PCB 104 is placed horizontally in water 103. Bottled water is preferred to ensure stability for repeat testing. Alternatively, tap water may be used. The water may have a temperature of from 20° C. to 25° C. The PCB may be submersed to a depth of 5 mm.

The PCB 104 itself may consist of a pair of comb patterns 108, 109. The patterns 108, 109 may be formed from spaced-apart copper tracks 111. The distance between the copper tracks 111 is the so-called "pitch" 110.

Typically, the pitch 110 varies between 0.3 mm and 5.0 mm, which are normal distances used on electronic components. Typically, the copper tracks 111 are between 0.5 mm and 2.0 mm wide.

To start the test, the power supply 101 is turned on at a set value, which remains constant over the whole test duration. Alternatively, a current limitation may be set, which reduces the applied power when a maximal current, e.g. of 60 mA or 180 mA, is reached, to protect the circuit, power supply and multimeter.

The set power value may be chosen as a function of the average, typical, minimal or maximal power that is generated on the electronic device when used. A typical average value for a battery connection of a smartphone is 4.7 V. A typical average value for a camera flash, a charge portal or a touchscreen device may be up to 24 V or higher.

Once the power is turned on via the power supply 101, the current that flows from the copper tracks 111 of one comb structure 108 to the copper tracks 111 of the other comb structure 109 is measured by multimeter 102 and is logged. This current is so-called "shortcut current", or "short circuiting current", as it means a current bridge is formed between the two comb patterns 108 and 109, which are separated from each other. In air, the resistance between the copper tracks 111 of comb structures 108 and 109 is very high, so no current is measured.

Damage in the form of corrosion and short circuiting is measured by an increase in current for a given applied voltage, which implies a decrease of resistance over the copper tracks 111 of the comb patterns 108 and 109.

The electrical shortcut test duration is typically up to 20 minutes, such as up to 15 minutes.

Comparison of "No Post Treatment" and "Post Treatment"

A coating was deposited onto a PCB having a pitch of 0.3 mm according to a conventional low pressure polymerisation method (Table 1). The polymer coating has a thickness of 400 nm. The precursor monomer used was an acrylate, namely 1H,1H,2H,2H-Perfluorodecyl acrylate.

TABLE 1

Conventional method (no post treatment)

| Parameter | Value |
| --- | --- |
| Plasma Chamber | |
| Dimensions | 700 × 700 × 1000 mm |
| Temperature wall | 30-60° C. |
| Electrodes | RF/ground |
| Pre-treatment | |
| Gas | Argon |
| Flow | 300-500 sccm |
| Power | 300-600 W |
| Frequency | 13.56 MHz |
| Frequency mode | Cw |
| Time | 5 minutes |
| Coating | |
| Monomer | 1H,1H,2H,2H-Perfluorodecyl acrylate |
| Flow | 25-50 sccm |
| Additional gas | — |
| Flow (% of monomer flow) | — |
| Base pressure | 10-30 mTorr |
| Work pressure | 20-75 mTorr |
| Power | 40-150 W |
| Frequency | 13.56 MHz |
| Frequency mode | cw |
| Time | 20 minutes |

A coating was deposited onto a PCB having a pitch of 0.3 mm according to a low pressure polymerisation method according to the invention (Table 2). The polymer coating had a thickness of 400 nm. The same precursor monomer to the conventional method was used, namely 1H,1H,2H,2H-Perfluorodecyl acrylate. The method according to the invention involved a second step subsequent to the polymerisation step, in which the polymer coating was exposed to Helium in the presence of a plasma (post treatment). The second step did not involve further deposition of polymer onto the PCB, but instead promoted a change in the physical properties of at least the surface of the polymer coating. As mentioned previously, the applicant has discovered that the density of the polymer coating on at least a surface thereof can be increased (without damaging the polymer coating) by exposing the polymer coating to an inert gas in the presence of a plasma.

TABLE 2

Method according to the invention (post treatment)

| Parameter | Value |
| --- | --- |
| Plasma Chamber | |
| Dimensions | 700 × 700 × 1000 mm |
| Temperature wall | 30-60° C. |
| Electrodes | RF/ground |
| Pre-treatment | |
| Gas | Argon |
| Flow | 300-500 sccm |
| Power | 300-600 W |
| Frequency | 13.56 MHz |
| Frequency mode | cw |
| Time | 5 minutes |
| Coating | |
| Monomer | 1H,1H,2H,2H-Perfluorodecyl acrylate |
| Flow | 25-50 sccm |
| Additional gas | — |
| Flow (% of monomer flow) | — |
| Base pressure | 10-30 mTorr |
| Work pressure | 20-75 mTorr |
| Power | 40-150 W |
| Frequency | 13.56 MHz |
| Frequency mode | cw |
| Time | 20 minutes |
| Post-treatment | |
| Gas | Helium |
| Flow | 50-200 sccm |
| Power | 50-150 W |
| Frequency | 13.56 MHz |
| Frequency mode | cw |
| Time | 5-10 minutes |

An electrical shortcut test (as described above) was conducted on each coated PCB (i.e. no post treatment and post treatment). The electrical shortcut test was carried out on two PCBs that had been subjected to the method of Table 1 (no post treatment) and two PCBs that had been subjected to the method of Table 2 (post treatment).

Figure 2:
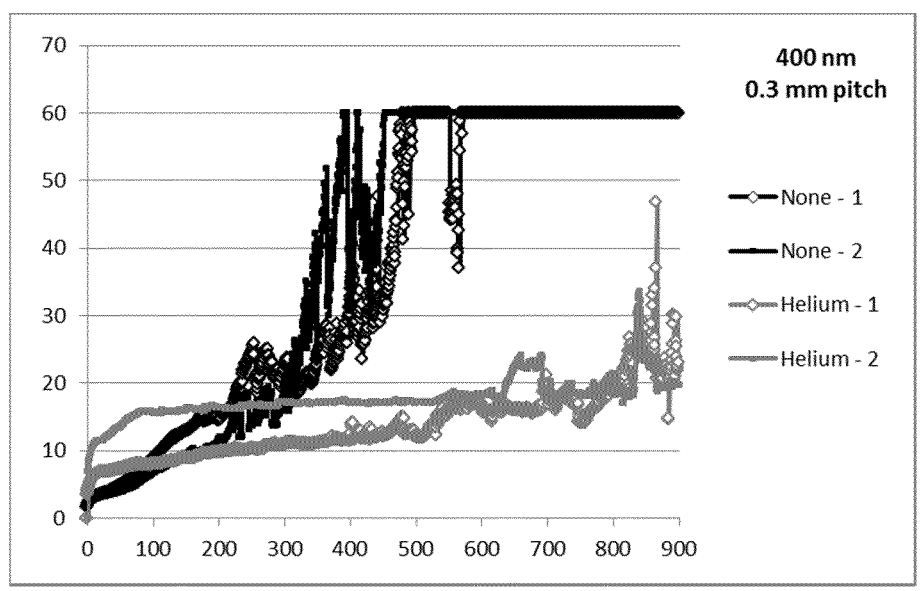
FIG. 2 shows a graph comparing (i) PCBs coated with a polymer having a thickness of 400 nm deposited using a conventional method (None); and (ii) PCBs coated with the same polymer as (i) having a thickness of 400 nm deposited using a method according to the invention (Helium)

FIG. 2 is a plot of the electrical shortcut test data. The current (mA) is shown along the y-axis and time (seconds) is shown along the x-axis.

The measured shortcut current after 900 seconds of water submersion has been recorded in Table 3 for the conventional method (no post treatment) and the inventive method (post treatment). Table 3 shows the average shortcut current measured from the two tests.

The degree of protection of the PCB afforded by the polymer coating is inversely proportional to the measured current. Thus, the lower the current the higher the degree of protection afforded by the polymer coating.

TABLE 3

Shortcut currents for no post-treatment vs post-treatment; 0.3 mm pitch; 400 nm polymer coating

| Post-treatment | Current (mA) after 900 seconds |
| --- | --- |
| No | 58.3 |
| Yes | 20.1 |

It is clear from Table 3 and FIG. 2 that after 900 seconds submersion, the helium post-treatment results are significantly better than without post-treatment. The effect of the post-treatment is significant even for such a narrow pitch—0.3 mm.

After 900 seconds submersion, the shortcut value for a 0.3 mm pitch PCB with post-treatment and a 400 nm thick coating is 65.5% lower than the shortcut value for a 0.3 mm pitch PCB without post-treatment.

Comparison of "No Post Treatment" and "Repeated Polymerisation/Post Treatment"

1. Polymer Coating Having a Thickness of 2 μm

2 μm polymer coatings were deposited onto PCBs having pitches of 0.3 mm, 1.1 mm and 5 mm according to the conventional low pressure polymerisation method (Table 1), with the exception that the coating time was increased from 20 minutes to 100 minutes. The reason for increasing the coating time is that it takes (under the conditions in Table 1) approximately 1 minute to deposit a coating having a thickness of approximately 20 nm. Thus, it follows that it will take approximately 100 minutes to deposit a coating having a thickness of approximately 2 μm. The precursor monomer used was an acrylate, namely 1H,1H,2H,2H-Perfluorodecyl acrylate.

2 μm polymer coatings were deposited onto PCBs having pitches of 0.3 mm, 1.1 mm and 5 mm according to a low pressure polymerisation method according to the invention (Table 4). The same precursor monomer to the conventional method was used, namely 1H,1H,2H,2H-Perfluorodecyl acrylate. The method according to the invention involved a second step subsequent to the polymerisation step, in which the polymer coating was exposed to Helium in the presence of a plasma (post treatment). The method additionally involved repeating the polymerisation and post-treatment steps a further nine times. In other words, the sequence was (first step:second step)×10.

TABLE 4

Method according to the invention - repeated polymerisation/post treatment

| Parameter | Value |
| --- | --- |
| Plasma Chamber | |
| Dimensions | 700 × 700 × 1000 mm |
| Temperature wall | 30-60° C. |
| Electrodes | RF/ground |
| Pre-treatment | |
| Gas | Argon |
| Flow | 300-500 sccm |
| Power | 300-600 W |
| Frequency | 13.56 MHz |
| Frequency mode | cw |
| Time | 5 minutes |
| Coating | |
| Monomer | 1H,1H,2H,2H-Perfluorodecyl acrylate |
| Flow | 25-50 sccm |
| Additional gas | — |
| Flow (% of monomer flow) | — |
| Base pressure | 10-30 mTorr |
| Work pressure | 20-75 mTorr |
| Power | 40-150 W |
| Frequency | 13.56 MHz |
| Frequency mode | cw |
| Time | 10 minutes |
| Post-treatment | |
| Gas | Helium |
| Flow | 50-200 sccm |
| Power | 50-150 W |
| Frequency | 13.56 MHz |
| Frequency mode | cw |
| Time | 1-5 minutes |

An electrical shortcut test was conducted on each coated PCB. The test was carried out twice for the PCBs having 0.3 mm and 1.1 mm pitches and once for the PCBs having a 5.0 mm pitch.

Figure 3A:
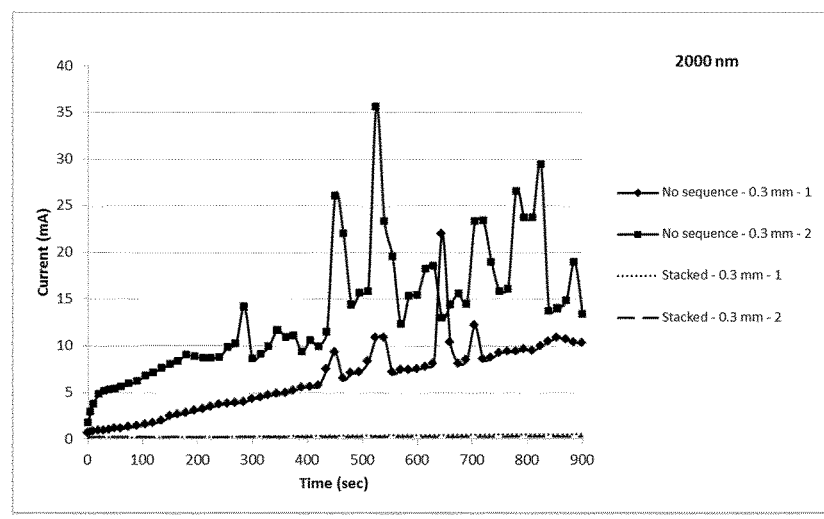
FIGS. 3A to 3C show graphs comparing (i) PCBs coated with a polymer having a thickness of 2000 nm deposited using a conventional method (No sequence); and (ii) PCBs coated with the same polymer as (i) having a thickness of 2000 nm deposited using a method according to the invention (Stacked)

FIGS. 3A (0.3 mm pitch), 3B (1.1 mm pitch) and 3C (5.0 mm pitch) are plots of the electrical shortcut test data.

The measured shortcut currents after 60 seconds and 900 seconds of water submersion have been recorded in Table 5 (0.3 mm pitch), Table 6 (1.1 mm pitch) and Table 7 (5.0 mm pitch) for the conventional method (no post treatment) and the inventive method (which involved repeating polymerisation and post treatment steps). Tables 5 and 6 show the average shortcut current measured from the two tests.

Figure 3B:
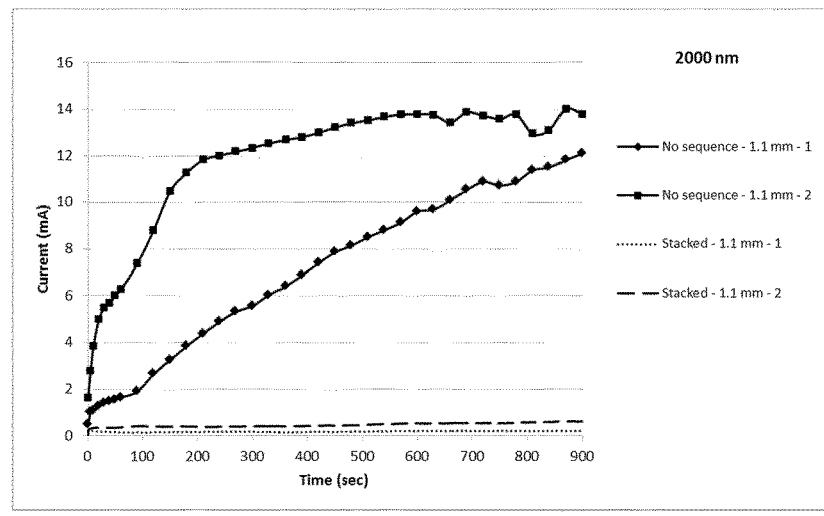
Figure 3C:
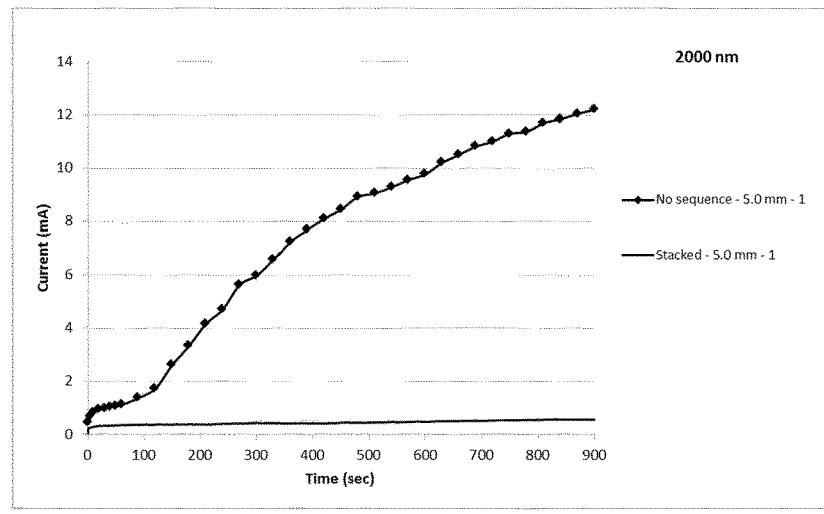

Table 5 to 7 and FIG. 3A to 3C show that a higher degree of protection of the PCB by the polymer coating can be afforded by conducting repeated polymerisation and post treatment steps.

TABLE 5

Shortcut currents for no post-treatment vs repeated polymerisation/post treatment; 0.3 mm pitch; 2 μm polymer coating

| Post-treatment | Current (mA) after 60 seconds | Current (mA) after 900 seconds |
| --- | --- | --- |
| No | 3.3 | 11.9 |
| Yes | 0.21 | 0.39 |

TABLE 6

Shortcut currents for no post-treatment vs repeated polymerisation/post treatment; 1.1 mm pitch; 2 μm polymer coating

| Post-treatment | Current (mA) after 60 seconds | Current (mA) after 900 seconds |
| --- | --- | --- |
| No | 4.0 | 12.9 |
| Yes | 0.25 | 0.41 |

TABLE 7

Shortcut currents for no post-treatment vs repeated polymerisation/post treatment; 5.0 mm pitch; 2 μm polymer coating

| Post-treatment | Current (mA) after 60 seconds | Current (mA) after 900 seconds |
| --- | --- | --- |
| No | 1.1 | 12.2 |
| Yes | 0.35 | 0.57 |

It is clear from Tables 5 to 7 and FIGS. 3A to 3C that after 900 seconds submersion, the repeated polymerisation/post treatment results are significantly better than without post treatment.

For example, after 60 seconds submersion, the shortcut value for a 0.3 mm pitch PCB with a 2 μm thick polymer coating deposited using repeated polymerisation/post treatment steps is 93.8% lower than the shortcut value for a 0.3 mm pitch PCB with a 2 μm thick polymer coating deposited without post treatment.

For example, after 900 seconds submersion, the shortcut value of a 1.1 mm pitch PCB with a 2 μm thick polymer coating deposited using repeated polymerisation/post treatment steps is 96.8% lower than the shortcut value of a 1.1 mm pitch PCB with a 2 μm thick polymer coating deposited without post treatment.

2. Polymer Coating Having a Thickness of 5 μm

5 μm polymer coatings were deposited onto PCBs having pitches of 0.3 mm, 1.1 mm and 5 mm according to the conventional low pressure polymerisation method (Table 1), with the exception that the coating time was increased from 20 minutes to 250 minutes to deposit the 5 μm coating. The precursor monomer used was an acrylate, namely 1H,1H,2H,2H-Perfluorodecyl acrylate.

5 μm polymer coatings were deposited onto PCBs having pitches of 0.3 mm, 1.1 mm and 5 mm according to a low pressure polymerisation method according to the invention (Table 4). The same precursor monomer to the conventional method was used, namely 1H,1H,2H,2H-Perfluorodecyl acrylate. The method according to the invention involved a second step subsequent to the polymerisation step, in which the polymer coating was exposed to Helium in the presence of a plasma (post treatment). The method additionally involved repeating the polymerisation and post-treatment steps a further twenty four times. In other words, the sequence was (first step:second step)×25.

An electrical shortcut test was conducted on each PCB.

Figure 4A:
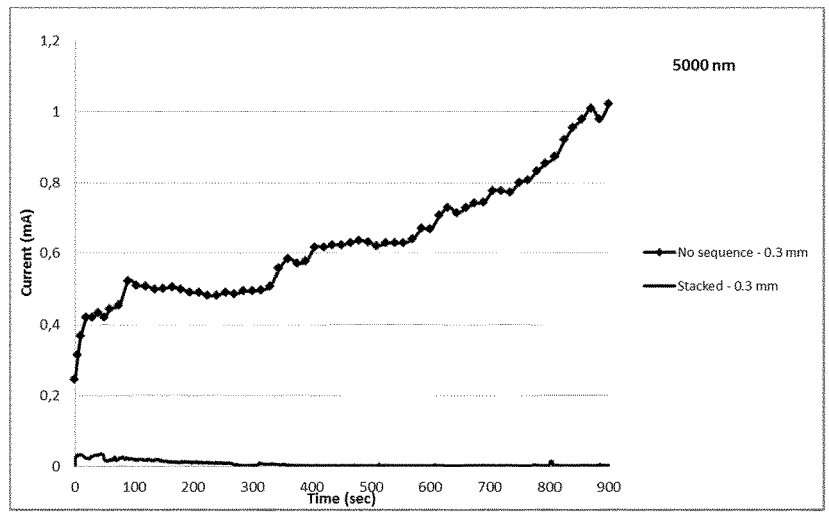
FIGS. 4A to 4C show graphs comparing (i) PCBs coated with a polymer having a thickness of 5000 nm deposited using a conventional method (No sequence); and (ii) PCBs coated with the same polymer as (i) having a thickness of 5000 nm deposited using a method according to the invention (Stacked)

FIGS. 4A (0.3 mm pitch), 4B (1.1 mm pitch) and 4C (5.0 mm pitch) are plots of the electrical shortcut test data.

The measured shortcut currents after 60 seconds and 900 seconds of water submersion have been recorded in Table 8 (0.3 mm pitch), Table 9 (1.1 mm pitch) and Table 10 (5.0 mm pitch) for the conventional method (no post treatment) and the inventive method (which involved repeating polymerisation and post treatment steps).

TABLE 8

Shortcut currents for no post-treatment vs repeated polymerisation/post treatment; 0.3 mm pitch; 5 µm polymer coating

| Post-treatment | Current (mA) after 60 seconds | Current (mA) after 900 seconds |
| --- | --- | --- |
| No | 0.44 | 1.02 |
| Yes | 0.02 < 0.1 | 0.002 < 0.1 |

TABLE 9

Shortcut currents for no post-treatment vs repeated polymerisation/post treatment; 1.1 mm pitch; 5 µm polymer coating

| Post-treatment | Current (mA) after 60 seconds | Current (mA) after 900 seconds |
| --- | --- | --- |
| No | 0.79 | 3.57 |
| Yes | 0.01 < 0.1 | 0.03 < 0.1 |

TABLE 10

Shortcut currents for no post-treatment vs repeated polymerisation/ post treatment; 5.0 mm pitch; 5 µm polymer coating

| Post-treatment | Current (mA) after 60 seconds | Current (mA) after 900 seconds |
| --- | --- | --- |
| No | 0.83 | 2.52 |
| Yes | 5.6E−09 < 0.1 | 2.02E−05 < 0.1 |

Figure 4B:
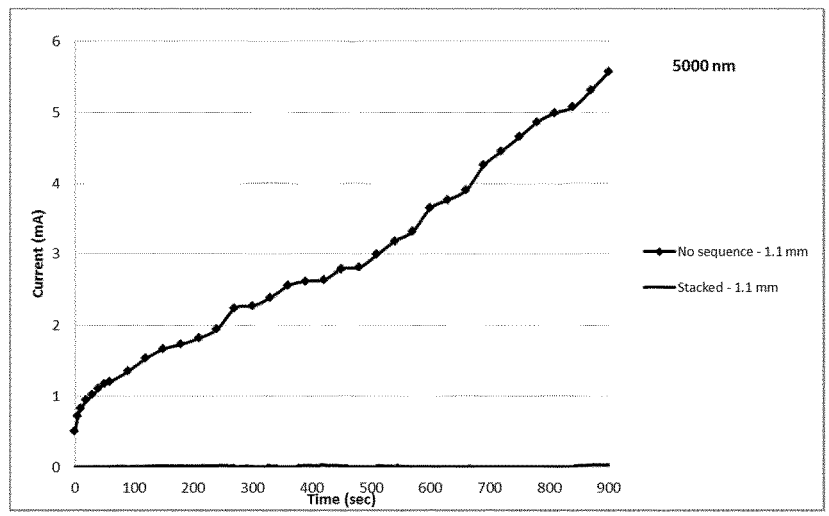
Figure 4C:
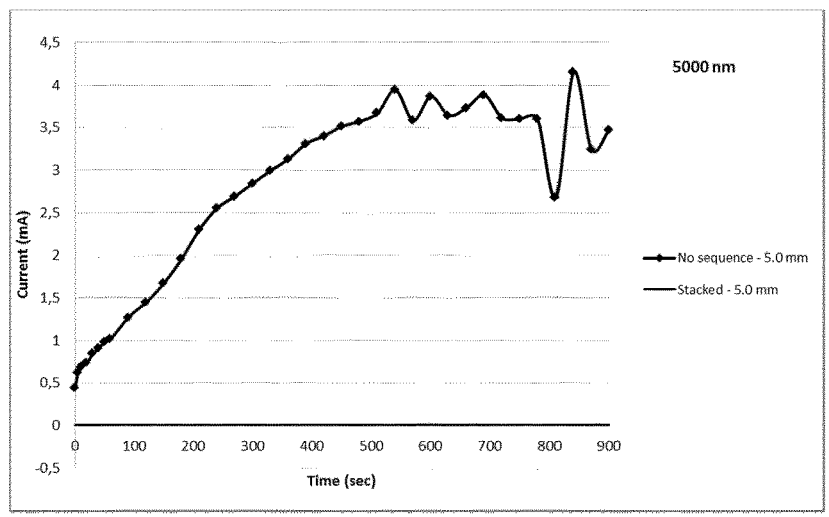

It is clear from Tables 8 to 10 and FIGS. 4A to 4C that after 900 seconds submersion, the repeated polymerisation/post treatment results are significantly better than without post treatment.

For example, after 60 seconds submersion, the shortcut value of a 0.3 mm pitch PCB with a 5 µm thick polymer coating deposited using repeated polymerisation/post treatment steps is 95.9% lower than the shortcut value of a 0.3 mm pitch PCB with a 5 µm thick polymer coating deposited without post treatment.

For example, after 15 minutes submersion, the shortcut value of a 1.1 mm pitch PCB with a 5 µm thick polymer coating deposited using repeated polymerisation/post treatment steps is 99.2% lower than the shortcut value of a 1.1 mm pitch PCB with a 5 µm thick polymer coating deposited without post treatment.

For the 3 measured pitches—0.3 mm, 1.1 mm and 5.0 mm—the 5 µm thick polymer coating deposited using repeated polymerisation/post treatment steps shows shortcut current values much lower than the limit of visual corrosion (0.1 mA).

3. Polymer Coating Having a Thickness of 8 µm

8 µm polymer coatings were deposited onto PCBs having pitches of 0.3 mm, 0.9 mm and 5 mm according to the conventional low pressure polymerisation method (Table 1), with the exception that the coating time was increased from 20 minutes to 400 minutes to deposit the 8 µm coating. The precursor monomer used was an acrylate, namely 1H,1H,2H,2H-Perfluorodecyl acrylate.

8 µm polymer coatings were deposited onto PCBs having pitches of 0.3 mm, 0.9 mm and 5 mm according to a low pressure polymerisation method according to the invention (Table 4). The same precursor monomer to the conventional method was used, namely 1H,1H,2H,2H-Perfluorodecyl acrylate. The method according to the invention involved a second step subsequent to the polymerisation step, in which the polymer coating was exposed to Helium in the presence of a plasma (post treatment). The method additionally involved repeating the polymerisation and post-treatment steps a further thirty nine times. In other words, the sequence went (first step:second step)×40

An electrical shortcut test was conducted on each PCB.

Figure 5A:
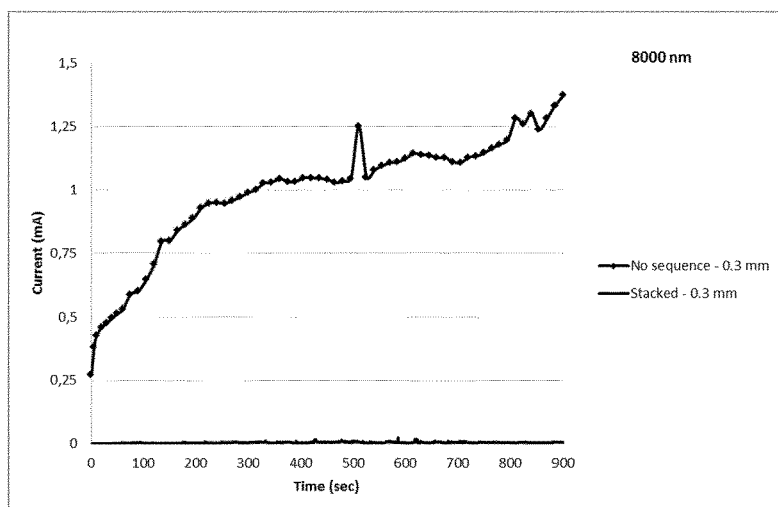
FIGS. 5A to 5C show graphs comparing (i) PCBs coated with a polymer having a thickness of 8000 nm deposited using a conventional method (No sequence); and (ii) PCBs coated with the same polymer as (i) having a thickness of 8000 nm deposited using a method according to the invention (Stacked)

FIGS. 5A (0.3 mm pitch), 5B (0.9 mm pitch) and 5C (5.0 mm pitch) are plots of the electrical shortcut test data.

The measured shortcut currents after 60 seconds and 900 seconds of water submersion have been recorded in Table 11 (0.3 mm pitch), Table 12 (0.9 mm pitch) and Table 13 (5.0 mm pitch) for the conventional method (no post treatment) and the inventive method (which involved repeating polymerisation and post treatment steps).

TABLE 11

Shortcut currents for no post-treatment vs repeated polymerisation/ post treatment; 0.3 mm pitch; 8 µm polymer coating

| Post-treatment | Current (mA) after 60 seconds | Current (mA) after 900 seconds |
| --- | --- | --- |
| No | 0.40 | 1.12 |
| Yes | 0.002 < 0.1 | 0.01 < 0.1 |

TABLE 12

Shortcut currents for no post-treatment vs repeated polymerisation/ post treatment; 0.9 mm pitch; 8 µm polymer coating

| Post-treatment | Current (mA) after 60 seconds | Current (mA) after 900 seconds |
| --- | --- | --- |
| No | 0.63 | 1.53 |
| Yes | 2.19E−06 < 0.1 | 1.39E−05 < 0.1 |

TABLE 13

Shortcut currents for no post-treatment vs repeated polymerisation/ post treatment; 5.0 mm pitch; 8 µm polymer coating

| Post-treatment | Current (mA) after 60 seconds | Current (mA) after 900 seconds |
| --- | --- | --- |
| No | 0.25 | 1.21 |
| Yes | 0.001 < 0.1 | 0.002 < 0.1 |

Figure 5B:
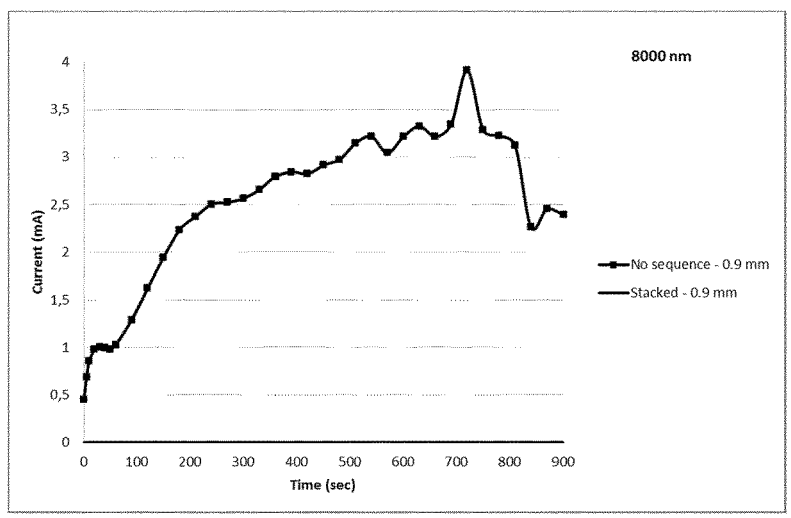
Figure 5C:
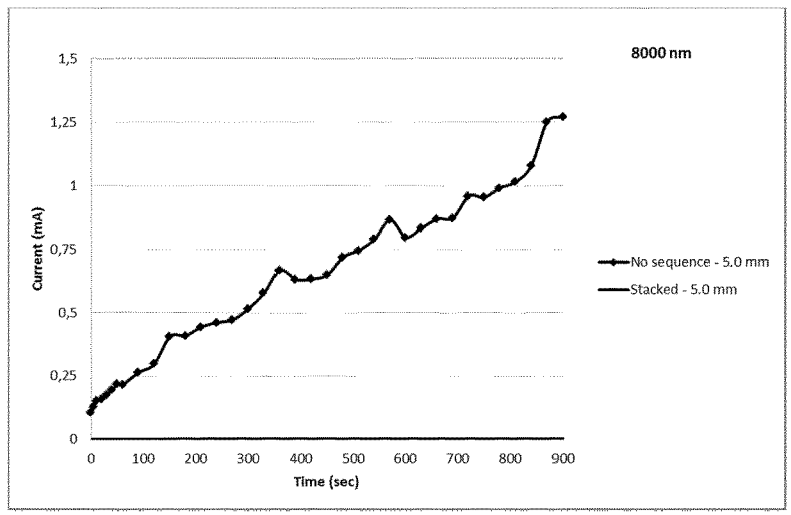

It is clear from Tables 11 to 13 and FIGS. 5A to 5C that after 900 seconds submersion, the repeated polymerisation/post treatment results are significantly better than without post treatment.

For example, after 60 seconds submersion, the shortcut value of a 0.3 mm pitch PCB with a 8 µm thick polymer coating deposited using repeated polymerisation/post treatment steps is 99.5% lower than the shortcut value of a 0.3 mm pitch PCB with a 8 µm thick polymer coating deposited without post treatment.

For example, after 900 seconds submersion, the shortcut value of a 0.9 mm pitch PCB with a 8 µm thick polymer coating deposited using repeated polymerisation/post treatment steps is 99.9% lower than the shortcut value of a 0.9 mm pitch PCB with a 8 µm thick polymer coating deposited without post treatment.

For the 3 measured pitches—0.3 mm, 0.9 mm and 5.0 mm—the 8 µm thick polymer coating deposited using repeated polymerisation/post treatment steps shows shortcut current values much lower than the limit of visual corrosion (0.1 mA).

Comparison of "No Supporting Layer" and "Supporting Layer"

A polymer coating was deposited onto a PCB having a pitch size of 1.1 mm according to the parameters and monomer listed in Table 14. The precursor monomer used was a siloxane, namely Hexamethyldisiloxane. The polymer coating had a thickness of 1000 nm and comprised only polyhexamethyldisiloxane (no supporting layer).

TABLE 14

Conventional method (no supporting layer)

| Parameter | Value |
|---|---|
| Plasma Chamber | |
| Dimensions | 500 × 400 × 250 mm |
| Temperature wall | 30-60° C. |
| Electrodes | RF/ground |
| Pre-treatment | |
| Gas | Argon |
| Flow | 10-200 sccm |
| Power | 50-300 W |
| Frequency | 13.56 MHz |
| Frequency mode | cw |
| Time | 1-5 minutes |
| Supporting layer | None |
| Coating | |
| Monomer | Hexamethyldisiloxane |
| Flow | 5-20 sccm |
| Additional gas | Oxygen (O$_2$) |
| Flow (% of monomer flow) | 5-20% |
| Base pressure | 10-20 mTorr |
| Work pressure | 20-50 mTorr |
| Power | 100-300 W |
| Frequency | 13.56 MHz |
| Frequency mode | cw |

A polymer coating was deposited onto a PCB having a pitch size of 1.1 mm according to the parameters and monomers listed in Table 15. The polymer coating comprised a first layer of a polymerised alkene, namely polyethylene, and a second layer of polymerised siloxane, namely polyhexamethyldisiloxane. The first layer had a thickness of approximately 200 nm and the second layer had a thickness of approximately 800 nm, resulting in a total polymer coating having a thickness of approximately 1000 nm.

TABLE 15

Method according to the invention (supporting layer)

| Parameter | Value |
|---|---|
| Plasma Chamber | |
| Dimensions | 500 × 400 × 250 mm |
| Temperature wall | 30-60° C. |
| Electrodes | RF/ground |
| Pre-treatment | |
| Gas | Argon |
| Flow | 10-200 sccm |
| Power | 50-300 W |
| Frequency | 13.56 MHz |
| Frequency mode | cw |
| Time | 1-5 minutes |
| Supporting layer | |
| Monomer | Ethylene |
| Flow | 5-20 sccm |
| Power | 100-300 W |
| Frequency | 13.56 MHz |
| Frequency mode | cw |
| Coating | |
| Monomer | Hexamethyldisiloxane |
| Flow | 5-20 sccm |
| Additional gas | Oxygen (O$_2$) |
| Flow (% of monomer flow) | 5-20% |
| Base pressure | 10-20 mTorr |
| Work pressure | 20-50 mTorr |
| Power | 100-300 W |
| Frequency | 13.56 MHz |
| Frequency mode | cw |

An electrical shortcut test was conducted on each PCB. The electrical shortcut test was carried out on two PCBs that had been subjected to the method of Table 14 (no supporting layer) and two PCBs that had been subjected to the method of Table 15 (supporting layer).

Figure 6:
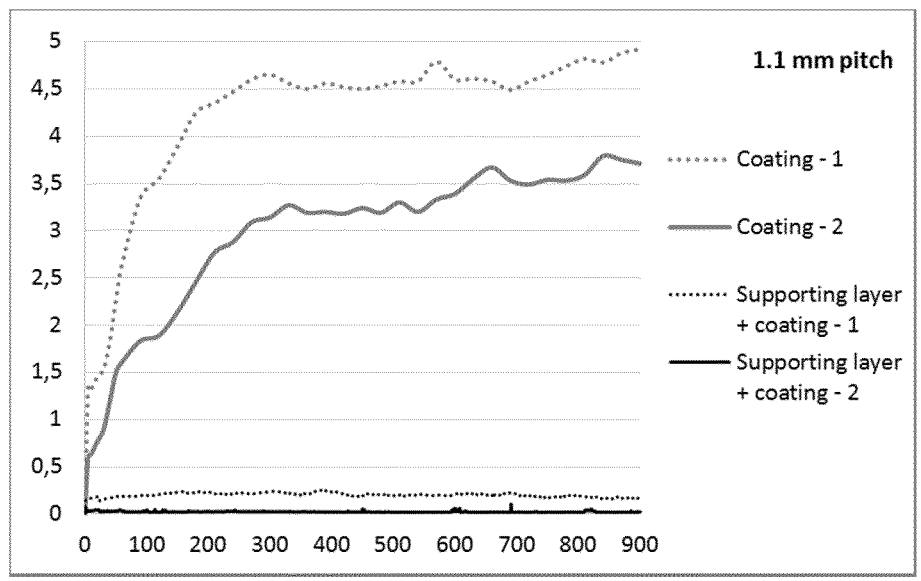
FIG. 6 shows a graph comparing (i) PCBs coated with a single polymer having a thickness of 1000 nm (no supporting layer); and (ii) PCBs coated with first and second polymer layers having a total thickness of 1000 nm (supporting layer).

FIG. 6 shows plots of the electrical shortcut test data.

The measured shortcut currents after 60 seconds and 900 seconds of water submersion have been recorded in Table 16. Table 16 shows the average shortcut current measured from the two tests.

TABLE 16

Shortcut currents comparing no supporting layer and supporting layer; 1.1 mm pitch; 1000 nm total polymer coating thickness

| Supporting layer | Coating layer | Current (mA) after 60 seconds | Current (mA) after 900 seconds |
|---|---|---|---|
| — | 1000 nm | 2.1 | 4.3 |
| 200 nm | 800 nm | 0.11 | 0.09 < 0.1 |

It is clear from Table 16 and FIG. 6 that by providing a polyethylene supporting layer beneath the polyhexamethyldisiloxane coating the shortcut currents are significantly lower than the shortcut currents for a single layer of polyhexamethyldisiloxane, which indicates that the polymer coating with supporting layer is more resistant to water than a conventional single layer coating.

For example, after 60 seconds submersion, the shortcut value of the 1.1 mm pitch PCB with a 200 nm polyethylene supporting layer and a 800 nm thick polyhexamethyldisiloxane coating (total coating thickness of 1000 nm) is around 0.1 mA, and is 94.7% lower than the shortcut value of a 1.1 mm pitch PCB without any supporting layer (coating thickness of 1000 nm).

For example, after 900 seconds submersion, the shortcut value of a 1.1 mm pitch PCB with a 200 nm polyethylene supporting layer and a 800 nm thick polyhexamethyldisiloxane coating (total coating thickness of 1000 nm) is below 0.1 mA and is 97.8% lower than the shortcut value of a 1.1 mm pitch PCB without any supporting layer (coating thickness of 1000 nm).

As used herein, the following terms have the following meanings:

"A", "an", and "the" as used herein refers to both singular and plural referents unless the context clearly dictates otherwise. By way of example, "a compartment" refers to one or more than one compartment.

"About" or "approximately" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" or "approximately" refers is itself also specifically disclosed.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, elements, members or steps, known in the art or disclosed therein.

The recitation of numerical ranges by endpoints includes all numbers and fractions subsumed within that range, as well as the recited endpoints.

The terms "outgassing" and "degassing", as used herein, are used interchangeably and refer to a process of removing gases and liquids, more in particular within the context of this document, removing contaminants, gases and liquids from the substrates to be coated, in order to ensure a good adhesion between coating and the exposed surfaces of the substrate.

The term inhibition is defined by a shortcut current value equal to or lower than 0.1 mA (100 µA) for an applied voltage of 4.7 V, when measured in a shortcut test as described further in this document. It has been noticed by the applicants that a shortcut current value equal to or lower than 0.1 mA is the upper limit for visual corrosion. When the maximum shortcut current during the test was equal to or lower than 0.1 mA during the complete test, the tested sample didnt show any signs of corrosion, whereas samples that had values above 0.1 mA did show corrosion spots.

The term substrate as used herein refers to any substrate that comprises electrical circuits or electrical connections or electrical connectors. Examples of substrates are electronic devices, such as smartphones, mobile phones, e-readers, tablets, computers, earphones, headphones, speakers, e.g. portable speakers. Another example of substrates are components of electronic devices, such as one or more printed circuit boards (PCBs), a battery, etc.

References to plasma powers as used herein are based on plasma chambers having a volume of approximately 500 litres and having conventional designs. Adjustment to the plasma power may necessary if the plasma chamber has a larger or smaller volume, or an unconventional design. For instance, the plasma wattage will usually be adjusted to a lower value when a plasma chamber having a volume smaller than 500 litres is utilised. Such adjustments are routine within the field and need not be discussed in detail.

The invention claimed is:

1. A method of depositing a multi-layer polymer coating having adjacent layers of the same polymer for protecting a substrate from corrosion, which method comprises in sequence:
   a first step including plasma polymerization of a precursor monomer and deposition of the resultant polymer onto at least one surface of a substrate;
   a second step including exposing the polymer to an inert gas in the presence of a plasma without further deposition of polymer onto the or each surface of the substrate, wherein the second step improves the water resistance of the polymer deposited in the first step;
   a third step including plasma polymerization of the precursor monomer used in the first step and deposition of the resultant polymer onto the polymer deposited in the first step so as to increase the thickness of the polymer, wherein the same polymer is deposited in the first step and the third step; and
   optionally, a fourth step including exposing the polymer to an inert gas in the presence of a plasma without further deposition of polymer onto the or each surface of the substrate, wherein the fourth step improves the water resistance of the polymer deposited in the third step.

2. A method according to claim 1, including repeating the third and fourth steps at least once more.

3. A method according to claim 1, including repeating the third and fourth steps up to ninety nine times.

4. A method according to claim 1, wherein each step including plasma polymerization of the precursor monomer is carried out for a duration that is greater than or equal to the duration of the step(s) including exposing the polymer to an inert gas in the presence of the plasma without further deposition of polymer.

5. A method according to claim 1, wherein the duration of the step(s) including exposing the polymer to an inert gas in the presence of the plasma without further deposition of polymer is from 10 seconds to 20 minutes.

6. A method according to claim 1, wherein the duration of the step(s) including exposing the polymer to an inert gas in the presence of the plasma without further deposition of polymer is from 10 seconds to 1 minute, or from 1 minute to 5 minutes or from 5 minutes to 10 minutes.

7. A method according to claim 1, wherein each step including plasma polymerization of the precursor monomer includes depositing polymer having a thickness from 10 nm to 500 nm.

8. A method according to claim 1, wherein the power of the plasma in the step(s) including exposing the polymer to an inert gas in the presence of the plasma without further deposition of polymer is from 50 Watts to 150 Watts.

9. A method according to claim 1, wherein the inert gas comprises Ar, $N_2$, He, Ne, Kr, Xe, or a mixture thereof.

10. A method according to claim 1, wherein the precursor monomer is: acrylate, methacrylate, or organosilane.

11. A method according to claim 10, wherein the precursor monomer is hexamethyldisiloxane or an organosilane having one or more alkenyl groups.

12. A method according to claim 11, wherein the or each alkenyl group is a vinyl.

13. A method according to claim 11, wherein the organosilane having one or more alkenyl groups is 1,3-divinyltetramethyldisiloxane.

14. A substrate having a polymer coating formed onto at least one surface thereof according to a method of claim 1.

15. A polymer coating according to claim 14, having a total thickness of 200 nm to 10000 nm.

* * * * *